United States Patent
Song et al.

(10) Patent No.: US 9,093,297 B2
(45) Date of Patent: Jul. 28, 2015

(54) SEMICONDUCTOR DEVICES INCLUDING A GATE STRUCTURE BETWEEN ACTIVE REGIONS, AND METHODS OF FORMING SEMICONDUCTOR DEVICES INCLUDING A GATE STRUCTURE BETWEEN ACTIVE REGIONS

(71) Applicant: Samsung Electronics Co., Ltd., Suwon-si (KR)

(72) Inventors: Tae-Yong Song, Seoul (KR); Seung-Ho Kim, Seoul (KR); Ja-Young Lee, Hwaseong-si (KR); Jin-Woo Lee, Yongin-si (KR); Hyun-Mi Ji, Daegu (KR)

(73) Assignee: Samsung Electronics Co., Ltd. (KR)

( * ) Notice: Subject to any disclaimer, the term of this patent is extended or adjusted under 35 U.S.C. 154(b) by 208 days.

(21) Appl. No.: 13/957,121

(22) Filed: Aug. 1, 2013

(65) Prior Publication Data

US 2014/0070291 A1    Mar. 13, 2014

(30) Foreign Application Priority Data

Sep. 12, 2012   (KR) ........................ 10-2012-0100890

(51) Int. Cl.

| H01L 27/108 | (2006.01) |
|---|---|
| H01L 27/088 | (2006.01) |
| H01L 29/66 | (2006.01) |
| H01L 21/762 | (2006.01) |
| H01L 21/8234 | (2006.01) |

(52) U.S. Cl.
CPC ........ *H01L 27/088* (2013.01); *H01L 27/10814* (2013.01); *H01L 27/10823* (2013.01); *H01L 27/10844* (2013.01); *H01L 27/10855* (2013.01); *H01L 27/10876* (2013.01); *H01L 27/10894* (2013.01); *H01L 29/66666* (2013.01); *H01L 21/76224* (2013.01); *H01L 21/76229* (2013.01); *H01L 21/823481* (2013.01)

(58) Field of Classification Search
None
See application file for complete search history.

(56) References Cited

U.S. PATENT DOCUMENTS

| 6,429,107 | B2 | 8/2002 | Kim et al. | |
|---|---|---|---|---|
| 7,855,109 | B2 | 12/2010 | Kim et al. | |
| 7,875,540 | B2 | 1/2011 | Jang et al. | |
| 8,013,375 | B2 | 9/2011 | Goo et al. | |
| 2008/0023754 | A1 | 1/2008 | Baek | |
| 2010/0102371 | A1* | 4/2010 | Yeom | 257/296 |
| 2010/0207203 | A1 | 8/2010 | Han | |
| 2011/0049599 | A1 | 3/2011 | Taketani | |
| 2011/0312139 | A1 | 12/2011 | Chun | |
| 2012/0007177 | A1* | 1/2012 | Ku | 257/334 |
| 2012/0012911 | A1* | 1/2012 | Jeong | 257/301 |

(Continued)

FOREIGN PATENT DOCUMENTS

| KR | 10-0780618 B1 | 11/2007 |
|---|---|---|
| KR | 2011-0076507 A | 6/2011 |

*Primary Examiner* — Julio J Maldonado
*Assistant Examiner* — Molly Reida
(74) *Attorney, Agent, or Firm* — Myers Bigel Sibley & Sajovec, PA

(57) ABSTRACT

Semiconductor devices are provided. The semiconductor devices may include an isolation pattern and first, second, and third active regions of a substrate. The first active region may be spaced apart from the second active region by a first width of the isolation pattern in a direction. A gate structure may be between the first and second active regions and may include a second width wider than the first width of the isolation pattern in the direction. Related methods of forming semiconductor devices are also provided.

20 Claims, 13 Drawing Sheets

(56) References Cited

U.S. PATENT DOCUMENTS

2012/0012912 A1* 1/2012 Kwon .......................... 257/302
2012/0043605 A1 2/2012 Kwon et al.
2012/0211813 A1* 8/2012 Taketani ...................... 257/296
2013/0196477 A1* 8/2013 Kang ........................... 438/270

* cited by examiner

SEMICONDUCTOR DEVICES INCLUDING A GATE STRUCTURE BETWEEN ACTIVE REGIONS, AND METHODS OF FORMING SEMICONDUCTOR DEVICES INCLUDING A GATE STRUCTURE BETWEEN ACTIVE REGIONS

CROSS-REFERENCE TO RELATED APPLICATION

This U.S. non-provisional patent application claims priority under 35 U.S.C. §119 to Korean Patent Application No. 10-2012-0100890, filed on Sep. 12, 2012 in the Korean Intellectual Property Office (KIPO), the disclosure of which is hereby incorporated herein by reference in its entirety.

BACKGROUND

Example embodiments relate to semiconductor devices and methods of forming semiconductor devices. As an integration degree of semiconductor devices such as Dynamic Random Access Memory (DRAM) devices has increased, a contact area of a contact may decrease and may thereby increase contact resistance. In addition, as the size of a Metal Oxide Semiconductor (MOS) transistor decreases, defects such as punch through, short channel effect, body portion leakage current, and gate-induced drain-leakage (GIDL), etc. may be generated.

SUMMARY

Various embodiments of the present inventive concepts provide a semiconductor device. The semiconductor device may include a substrate including first, second, and third active regions defined by a device isolation layer pattern, each of the first, second, and third active regions including an isolated shape in a first/longitudinal direction, the first and third active regions being arranged in parallel in the first direction, and the first and second active regions being spaced apart and immediately adjacent each other in the first direction. The semiconductor device may include first and second trenches in the substrate. The semiconductor device may include a first buried gate structure in the first trench in the first active region. The semiconductor device may include a second buried gate structure in the second trench between upper sidewalls of the first and second active regions, respectively, the second buried gate structure including a line shape extending in a second direction and a second width that is wider in the first direction than a first width of the device isolation layer pattern between the first and second active regions. Moreover, the semiconductor device may include first and second impurity regions at surface portions of the substrate in the first active region at opposing sides of the first buried gate structure. In some embodiments, a bottom surface of the second buried gate structure may contact an upper surface of the device isolation layer pattern. In some embodiments, the second buried gate structure may protrude from an interface with the device isolation layer pattern.

In various embodiments, the semiconductor device may include a fourth active region spaced apart from and immediately adjacent the first active region in the first direction. The semiconductor device may include a third buried gate structure in a third trench between upper sidewalls of the first and fourth active regions, respectively. The upper sidewall of the first active region adjacent the second buried gate structure may include a first upper sidewall of a first end portion of the first active region and may contact a sidewall of the second buried gate structure. The upper sidewall of the first active region adjacent the third buried gate structure may include a second upper sidewall of a second end portion of the first active region and may contact a sidewall of the third buried gate structure.

According to various embodiments, the second buried gate structure may include a gate insulating layer, a buried gate electrode, and an insulating layer pattern. The gate insulating layer may be on an inner wall of the second trench. Moreover, the gate insulating layer may contact the respective upper sidewalls of the first and second active regions. In some embodiments, an upper corner of an end portion of the first active region may include a linear shape. In some embodiments, an end portion of the first active region may include an equivalent shape to a sidewall of the second buried gate structure.

In various embodiments, the semiconductor device may include a third buried gate structure in a third trench in the first active region. An upper surface of a portion of the first active region between the first and third buried gate structures may contact a first contact. An upper surface of a portion of the first active region between the first and second buried gate structures may contact a second contact. In some embodiments, the semiconductor device may include a bit line on an upper surface of the first contact and a capacitor on an upper surface of the second contact.

A method of forming a semiconductor device, according to various embodiments, may include forming first, second, and third preliminary active regions each including an isolated shape including a longitudinal direction in a first direction, the first and second preliminary active regions being spaced apart and immediately adjacent each other in the first direction, and the first and third preliminary active regions being arranged in parallel to the first direction, by forming a preliminary device isolation layer pattern in a substrate. The method may include forming first and second trenches in the substrate extending in a second direction by partially etching the substrate in the first preliminary active region and the preliminary device isolation layer pattern, to provide first and second active regions and a device isolation layer pattern. The method may include forming a first buried gate structure in the first trench in the first active region. The method may include forming a second buried gate structure in the second trench between upper sidewalls of the first and second active regions, the buried gate structure including a second width wider in the first direction than a first width of the device isolation layer pattern between the first and second active regions. Moreover, the method may include forming impurity regions at surface portions of the substrate in the first active region at opposing sides of the first buried gate structure.

In various embodiments, the preliminary device isolation layer pattern between the first and second preliminary active regions may include a narrower width than the second width of the buried gate structure. In some embodiments, forming the first and second trenches may include forming the first trench to a first depth in the substrate that is shallower than a second depth of the second trench overlying the device isolation layer pattern. In some embodiments, forming the second buried gate structure may include forming an insulating layer on an inner wall of the second trench, forming a buried gate electrode on the gate insulating layer to fill a portion of the second trench, and forming an insulating layer pattern on the buried gate electrode to fill the second trench.

A semiconductor device, according to various embodiments, may include a substrate and an isolation pattern in the substrate. The semiconductor device may include first, second, and third active regions of the substrate, the first active region between the second and third active regions in a direction, and the first active region including an end portion immediately adjacent the second active region in the direction and spaced apart from the second active region by a first width of the isolation pattern in the direction. Moreover, the semiconductor device may include a gate structure between the first and second active regions and including a second width wider than the first width of the isolation pattern in the direction. In some embodiments, the gate structure between the first and second active regions may overly the isolation pattern.

In various embodiments, the end portion immediately adjacent the second active region in the direction may include a first end portion, and the first active region may include a second end portion immediately adjacent the third active region in the direction. In some embodiments, the gate structure may include a first gate structure, the semiconductor device may include a second gate structure between the first and third active regions, and the first and second end portions of the first active region may physically contact the first and second gate structures, respectively. Moreover, the semiconductor device may include first and second contacts physically contacting the first and second gate structures.

BRIEF DESCRIPTION OF THE DRAWINGS

The above and other features and advantages of the disclosure will become more apparent in view of the attached drawings and accompanying detailed description.

FIGS. 1 to 8 represent non-limiting, example embodiments as described herein.

FIG. 1 is a plan view illustrating a semiconductor device with a buried gate in accordance with various embodiments.

FIG. 2 is a cross-sectional view taken along a line I-I' in FIG. 1.

FIG. 3 is a plan view illustrating a semiconductor device with a buried gate structure in accordance with various embodiments.

FIG. 6 is a cross-sectional view illustrating a DRAM device with the buried gate illustrated in FIG. 1.

FIG. 8 is a block diagram illustrating a schematic diagram of a computing system in accordance with various embodiments.

DETAILED DESCRIPTION

Figure 1:
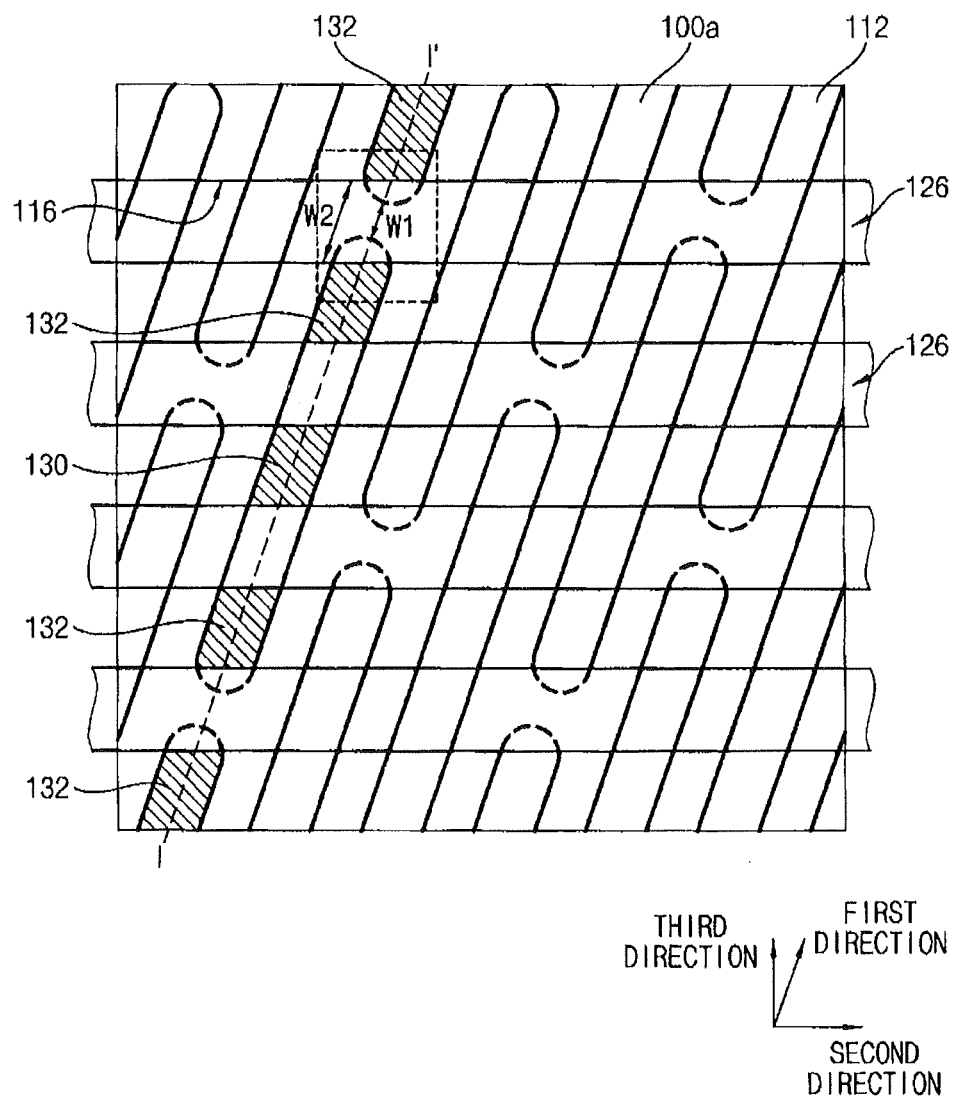

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
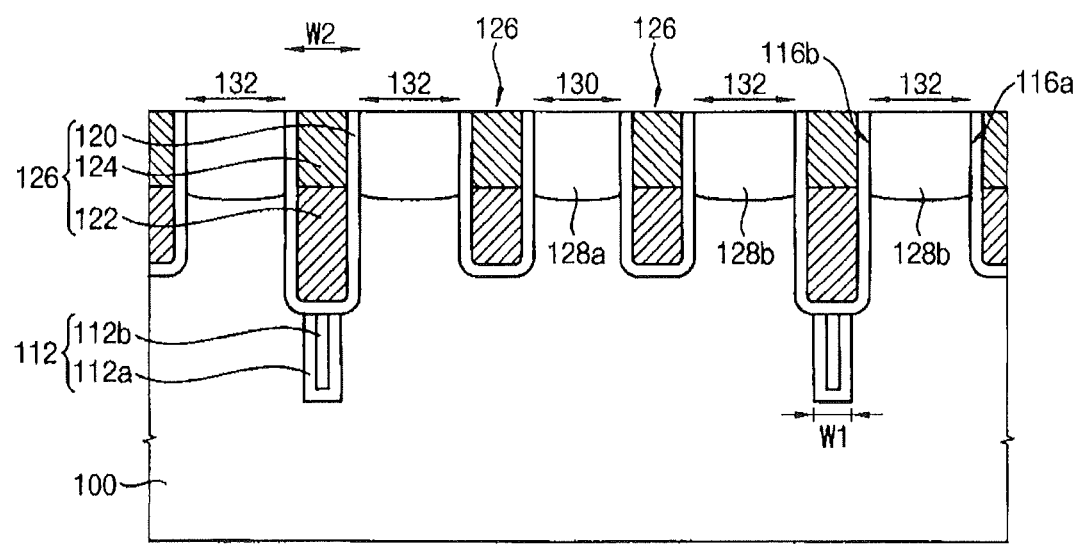

FIG. 1 is a plan view illustrating a semiconductor device with a buried gate in accordance with various embodiments. FIG. 2 is a cross-sectional view taken along a line I-I' in FIG. 1. Hereinafter, an extended longitudinal direction of active regions may be called a first direction, an extended direction of a buried gate structure may be called a second direction, and a vertical direction of the second direction may be called a third direction.

Referring to FIGS. 1 and 2, a substrate 100 including active regions 100a defined by a device isolation layer pattern 112 may be provided. The active regions 100a may have an isolated island shape in the first direction and may be arranged in parallel to the first direction. On the substrate 100, a trench 116 for gate may be formed. In the trench 116 for gate, a buried gate structure 126 having an extended line shape in the second direction may be provided. The buried gate structure 126 may be provided between upper side walls of the isolated active regions 100a separated in the first direction and may have a greater width W2 than the width W1 of the device isolation layer pattern 112 between the active regions separated in the first direction.

The substrate 100 may include a single crystalline semiconductor substrate. In the field region of the substrate 100, a trench for isolating devices may be formed. The device isolation layer pattern 112 may have a buried shape by an insulating layer in the trench for isolating devices. Particularly, the device isolation layer pattern 112 may have a stacked structure of a silicon nitride layer 112a and a silicon oxide layer 112b. As illustrated in the drawings, the silicon nitride layer 112a may be formed along the side wall and the bottom surface of the trench for isolating devices. The silicon oxide layer 112b may have a shape of filling up the trench for isolating devices on the silicon nitride layer 112a. The upper surface of the device isolation layer pattern 112 may have a planar shape.

In a portion of the device isolation layer pattern 112, a buried gate structure 126 may be formed, and in a remaining portion, the buried gate structure 126 may not be formed. On a portion of the device isolation layer pattern 112 including the buried gate structure 126, the height of the upper surface of the device isolation layer pattern 112 may be relatively low. In addition, on a portion of the device isolation layer pattern 112 excluding the buried gate structure 126, the upper surface of the device isolation layer pattern 112 may be disposed at almost the same plane as the planar upper surface of the substrate (hereinafter, "the main surface of the substrate") and may be relatively high.

The first direction, which may be the longitudinal direction of the active region 100a, may not be vertical to the second direction. That is, the first direction may be diagonal to the second direction. In addition, the active regions 100a may be disposed in a row in parallel with the first direction.

On a portion of the device isolation layer pattern 112 positioned between the active regions 100a disposed in parallel to the first direction, the buried gate structure 126 may be provided. The portion of the device isolation layer pattern 112 between the active regions that are separated in the first direction may have a first width W1 in the first direction. The first width W1 may be smaller than the second width W2 of the buried gate structure 126 in the first direction.

The trenches 116 for gates may be disposed in parallel to each other with a constant distance. When examining the trenches 116 for gates having a line shape, the trenches 116 for gates may have different depth from each other according to the formed position due to the etching amount difference of the substrate in the active region and a preliminary device isolation layer pattern. As illustrated in FIG. 2, the trench 116b for gate positioned on the device isolation layer pattern 112 may have a greater depth than that of the trench 116a for gate positioned at the active region 100a.

The trenches 116b for gates with respect to one of the isolated active regions 100a are explained herein in detail. In one isolated active region 100a, two trenches for gates, that is, first and second trenches, may be disposed in parallel with a distance therebetween. Thus, the buried gate structures 126 provided in the first and second trenches may become the gate of each transistor. Accordingly, two transistors may be provided in the isolated active region 100a.

In addition, at both end portions of the isolated active region 100a in the first direction, third and fourth trenches may be disposed, respectively. The upper side wall at both edge portions of the isolated active region may make contact with the third and fourth trenches. Thus, the edge position of the isolated active region 100a may be determined by the position of the third and fourth trenches. Accordingly, the upper side wall at both edge portions of the isolated active region 100a may not make contact with the device isolation layer pattern 112. In this case, the width of the third and fourth trenches may be greater than the upper width of the device isolation layer pattern 112 positioned at a gap portion between the isolated active regions 100a.

As described herein, the edge portion of the isolated active region 100a may have the same shape as the side wall of the trench 116 for gate. Thus, an upper corner portion of the edge portion of the isolated active region 100a may not have a rounded shape but may have a nearly linear shape as illustrated in the plan view in FIG. 1.

Because the buried gate structure 126 may be provided in the trench 116 for gate, the side wall shape of the buried gate structure 126 may be the same as the side wall shape of the trench 116 for gate. Accordingly, the edge portion of the isolated active region 100a may be the same as the side wall of the buried gate structure 126. In addition, the upper corner of the edge portion of the isolated active region 100a may not have a rounded shape but may have a nearly linear shape as illustrated in the plan view in FIG. 1.

The buried gate structure 126 may include a gate insulating layer 120, a buried gate electrode 122 and an insulating layer pattern 124. The gate insulating layer 120 may be provided on the inner wall of the trench 116 for gate. That is, the gate insulating layer 120 may cover the side wall of both edge portions of each active region 100a. The gate insulating layer 120 may be a thermal oxidation layer formed by oxidizing the surface of the substrate 100. Alternatively, the gate insulating layer 120 may be a silicon oxide layer formed by a chemical vapor deposition method.

Because the side wall of the active regions 100a that are separated in the first direction may be exposed to both sides of the trench 116 for gate, respectively, the active regions 100a may be required to be insulated. Thus, the gate insulating layer 120 may insulate the isolated and separated active regions from each other, as well as function as the gate insulating layer of the transistor. Accordingly, the gate insulating layer 120 may have a sufficient thickness for insulating the separated and isolated active regions 100a from each other.

The buried gate electrode 122 may include a metal material or a polysilicon material. Particularly, the buried gate electrode 122 may have a stacked structure of a barrier metal layer and a metal layer. The barrier metal layer may include titanium, titanium nitride, etc. The metal layer may include tungsten, etc. The buried gate electrode 122 may have a shape of partially filling up the trench 112 for gate. Accordingly, the buried gate electrode 122 may have an upper surface lower than the main surface of the substrate 100.

The insulating layer pattern 124 may be provided on the buried gate electrode 122 and may have a shape of filling up the upper portion of the trench 116 for gate. The insulating layer pattern 124 may include a nitride layer, an oxide layer, or a stacked structure of a nitride layer and the oxide layer.

As described herein, the upper side wall of both edge portions of the isolated active region 100a may make contact with a buried gate structure 126. In addition, the upper side wall of both edge portions of the isolated active region 100a may not make contact with the device isolation layer pattern 112.

The second width W2 of the buried gate structure 126 in the first direction may be greater than the first width W1 of the device isolation layer pattern 112 positioned between the active regions 100a separated in the first direction. Thus, in the portion between the active regions 100a separated in the first direction, a stacked shape of the device isolation layer pattern 112 having the first width W1 and the buried gate structure 126 having the second width W2 may be provided. In addition, the side wall profile at the interface portion of the device isolation layer pattern 112 and the buried gate structure 126 may have a bent shape as illustrated in the cross-sectional view in FIG. 2.

Impurity regions 128a and 128b positioned at the surface portion of the substrate 100 in the active region 100a between the buried gate structures 126 may be provided as source/drain regions of a buried transistor. As illustrated in the drawings, a first impurity region 128a may be provided at the center portion of the active region 100a, and a second impurity region 128b may be provided at both edge portions of the active region 100a. The upper surface of a portion of the active region 100a including the first impurity region 128a may be a first contact forming region 130, and the upper surface of a portion of the active region 100a including the second impurity region 128b may be a second contact forming region 132.

As illustrated in the drawings, two (e.g., first and second) buried gate structures 126 having a line shape may be provided at the isolated active region 100a. In addition, third and fourth buried gate structures 126 making contact with both edge portions of the isolated active region 100a may be provided. Here, the upper surface of the active region 100a positioned between the first and second buried gate structures 126 may be a first contact forming region 130. In addition, the upper surface between the first buried gate structure 126 and one edge portion of the active region 100a and the upper surface between the second buried gate structure 126 and the other edge portion of the active region 100a may become second contact forming regions 132, respectively. Accordingly, one first contact forming region 130 and two second contact forming regions 132 may be provided at the isolated active region 100a.

For a Dynamic Random Access Memory (DRAM) device, the first contact forming region 130 may make an electrical connection with a bit line through a bit line contact. In addition, the second contact forming region 132 may make an electrical connection with a capacitor through a storage node contact.

As illustrated in FIG. 1, an edge portion of the isolated active region 100a may be extended to a side wall portion of the buried gate structure 126. In addition, the edge portion of the isolated active region 100a may not have a rounded shape but may have a nearly linear shape as the side wall of the buried gate structure 126. Thus, the area of the upper surface of the second contact forming region 132 at the isolated active region 100a may be sufficiently increased. Because the contact area of a contact formed on the second contact forming region 132 may increase, the contact resistance of the contact formed on the second contact forming region 132 may decrease.

Although some example embodiments of a semiconductor device have been explained referring to FIG. 1, the arrangement of the active regions 100a may not be limited to FIG. 1, but various modified embodiments may be illustrated. That is, the active regions 100a may be arranged in a row in parallel in the first direction, and each of the active regions 100a may be separated from each other in the first direction. However, the angle in the first direction may be changed variously in the active regions 100a. In addition, the distance and the shape of each of the active regions 100a disposed in the second direction may be changed diversely.

Figure 3:
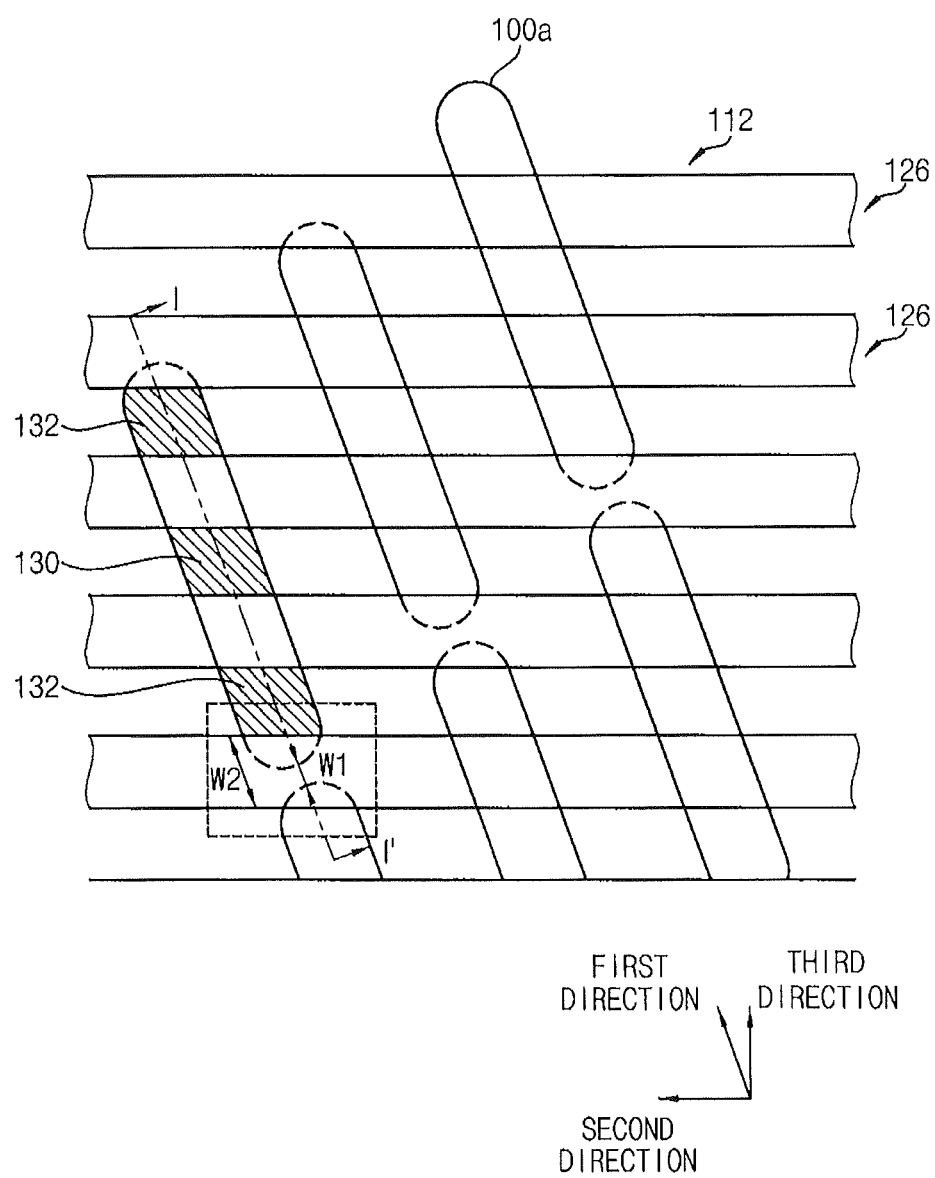

FIG. 3 is a plan view illustrating a semiconductor device with a buried gate structure 126 in accordance with modified example embodiments. The angle of the active regions 100a in the first direction in the semiconductor device illustrated in FIG. 3 is different from that illustrated in FIG. 1. In addition, the distance between the active regions 100a in the second direction may be different. However, the cross-sectional view taken along a line I-I' in FIG. 3 may be the same as illustrated in FIG. 2.

Each of the elements included in the semiconductor device illustrated in FIG. 3 may have the same constitution as explained referring to FIG. 1. That is, the active region 100a defined by the device isolation layer pattern 112 may have an isolated island shape. The first direction, which may be the longitudinal direction of the active region 100a may not be vertical to the second direction but may be diagonal. The active regions 100a may be arranged in a row in parallel to the first direction.

In addition, a buried gate structure 126 may be provided between the upper side walls of each of the active regions 100a disposed in parallel to the first direction. At the portion between the active regions 100a separated in the first direction, a second width W2 of the buried gate structure 126 in the first direction may be larger than a first width W1 of the device isolation layer pattern 112 positioned in the first direction under the buried gate structure 126. Therefore, the side wall profile at the interface portion of the device isolation layer pattern 112 and the buried gate structure 126 may have a bent shape as illustrated in the cross-sectional view in FIG. 2.

As described herein, the side wall of both edge portions in the isolated active region 100a may have a shape making contact with the buried gate structure 126 in the first direction. The side wall at both edge portions of the isolated active region 100a may be insulated by a gate insulating layer 120 included in the buried gate structure. In addition, the upper side wall of both edge portions of the isolated active region 100a may not make contact with the device isolation layer pattern 112.

FIGS. 4A to 4F are cross-sectional views illustrating a method for fabricating a semiconductor device with the buried gate illustrated in FIGS. 1 and 2 in accordance with various embodiments. FIGS. 5A to 5D are plan views illustrating a method for fabricating a semiconductor device with the buried gate illustrated in FIGS. 1 and 2 in accordance with various embodiments.

Figure 4A:
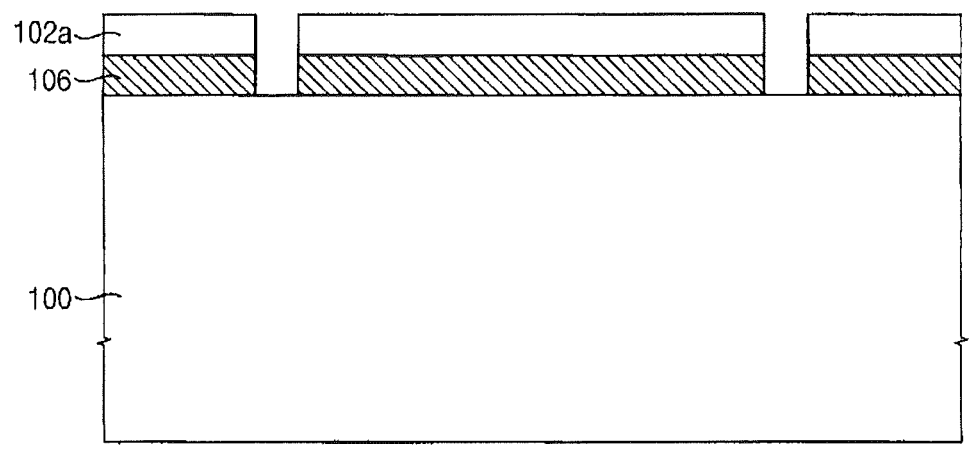
FIGS. 4A to 4F are cross-sectional views illustrating a method for fabricating a semiconductor device with the buried gate illustrated in FIGS. 1 and 2 in accordance with various embodiments.
Figure 5A:
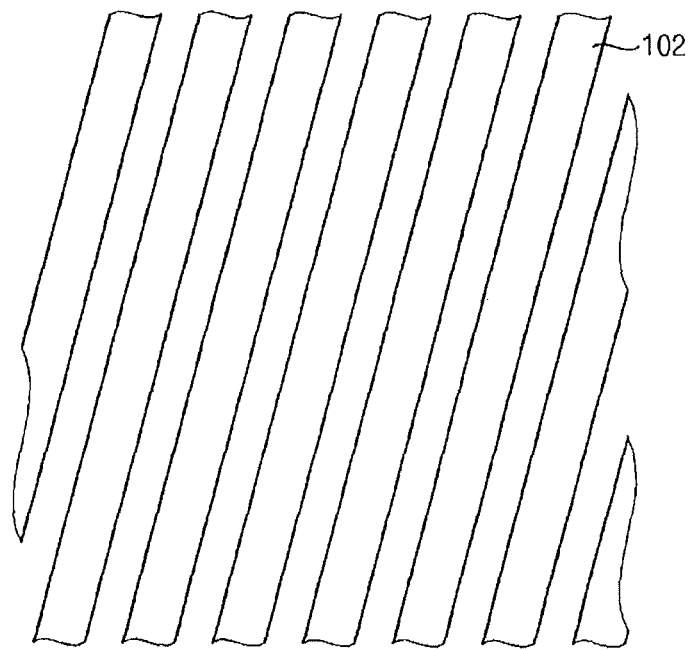
FIGS. 5A to 5D are plan views illustrating a method for fabricating a semiconductor device with the buried gate illustrated in FIGS. 1 and 2 in accordance various embodiments.
Figure 5B:
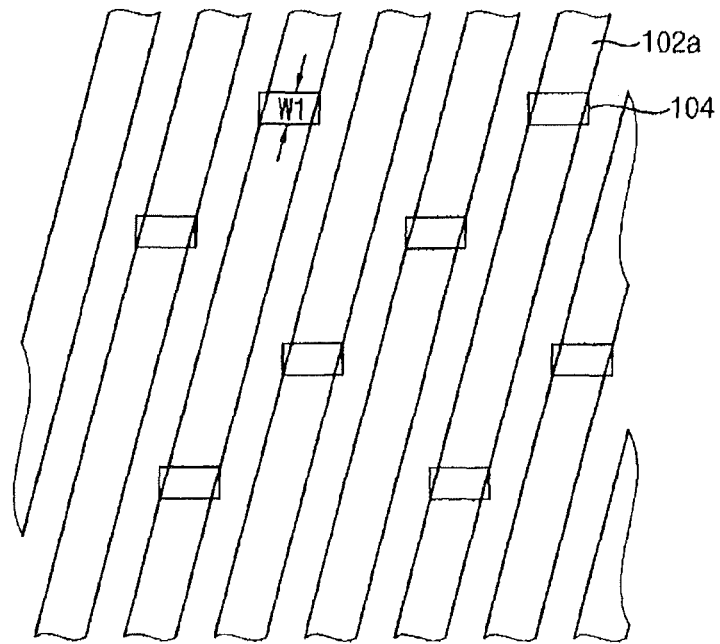

Referring to FIGS. 4A, 5A and 5B, a first hard mask pattern 106 for forming a trench for isolating devices may be formed on a substrate 100 that may include single crystalline silicon. To form the first hard mask pattern 106, a first hard mask layer may be formed on the substrate 100. The first hard mask layer may include silicon oxide, silicon nitride, etc. On the first hard mask layer, a first photoresist pattern 102a may be formed. The first photoresist pattern 102a may have a shape covering the active region 100a on the substrate 100.

An example of forming the first photoresist pattern 102a is illustrated in FIGS. 5A and 5B. A photoresist layer may be coated on the first hard mask layer. Then, a first preliminary photoresist pattern 102 having a line and space shape may be formed through a photolithography process as illustrated in FIG. 5A. The first preliminary photoresist pattern 102 may be formed by performing a double patterning process. The first preliminary photoresist pattern 102 may have a line shape extended in the first direction. Then, a portion 104 corresponding to a field region of the first preliminary photoresist pattern 102 may be removed by a trimming process. Then, as illustrated in FIG. 5B, the portion 104 of the first preliminary photoresist pattern 102 may be removed to form the first photoresist patterns 102a arranged in a row in parallel to the first direction (as illustrated in FIG. 1) and having an isolated island shape, respectively. A first width W1 of the removed portion 104 by the trimming process may be the width of a device isolation layer pattern 112 between the active regions 100a separated in the first direction from each other. Thus, the width W1 of the removed portion 104 through the trimming process may be smaller than the predetermined width of a buried gate structure 126 to be formed.

Then, the first hard mask layer may be etched by using the first photoresist pattern 102a as an etching mask to form the first hard mask pattern 106. A plurality of the first hard mask patterns 106 may have an isolated island shape and may be arranged in a row in parallel in the first direction. In this case, the width W1 between each of the first hard mask patterns 106 disposed in a row in the first direction may be smaller than the predetermined width of the buried gate structure 126. Thus, the device isolation region may be decreased, while the active region 100a may be increased.

Figure 4B:
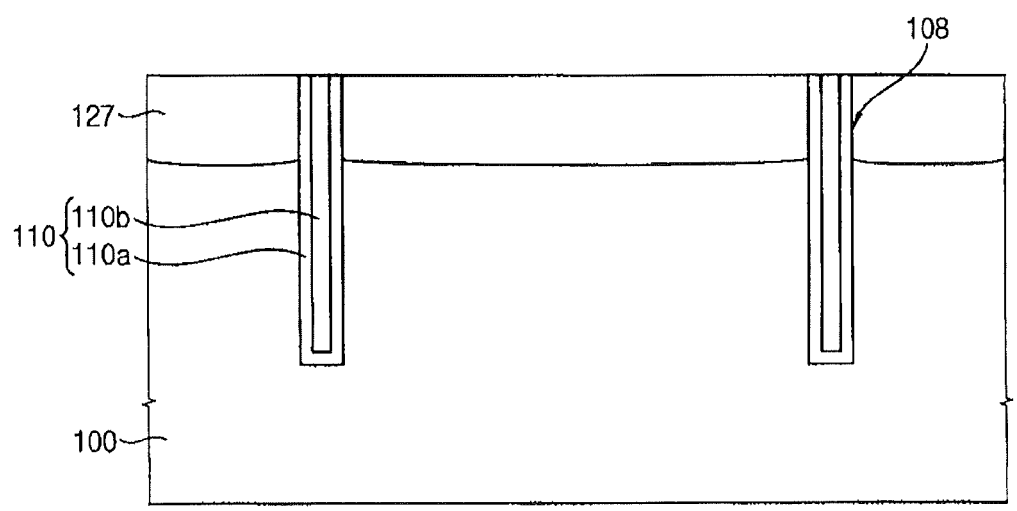
Figure 5C:
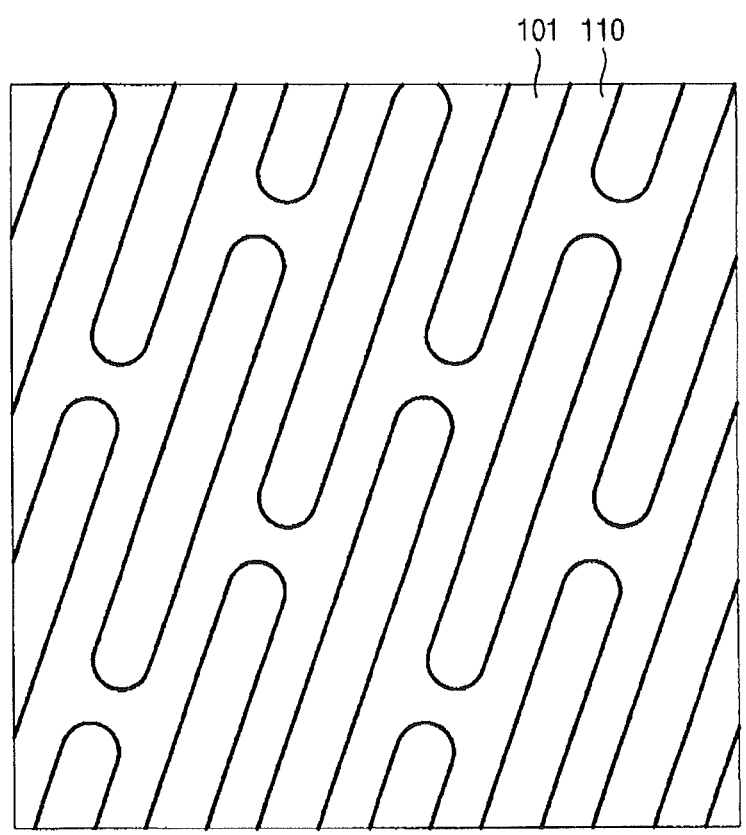

Referring to FIGS. 4B and 5C, a trench 108 for isolating devices may be formed by anisotropically etching the substrate 100 by using the first hard mask pattern 106 as an etching mask. The substrate 100 may then have a relatively extruding shape. Accordingly, the planar surface of the substrate 100 at the extruding portion may be provided as a preliminary active region 101.

An insulating layer may be formed in the trench 108 for isolating devices and planarized to form a preliminary device isolation layer pattern 110. In some embodiments, a silicon nitride layer 110a may be formed along the inner surface of the trench 110a for isolating devices. On the silicon nitride layer 110a, a silicon oxide layer 110b completely filling up the inner portion of the trench 108 for isolating devices may be formed. Then, the silicon oxide layer 110b and the silicon nitride layer 110a may be planarized to form the preliminary device isolation layer pattern 110. The silicon oxide layer 110b may include an oxide layer such as a high density plasma (HDP) oxide, a spin-on dielectric (SOD) layer, etc.

Then, the first hard mask pattern 106 may be removed. A preliminary impurity region 127 may be formed at the surface portion of the substrate 100 by doping impurities into the substrate 100.

Figure 4C:
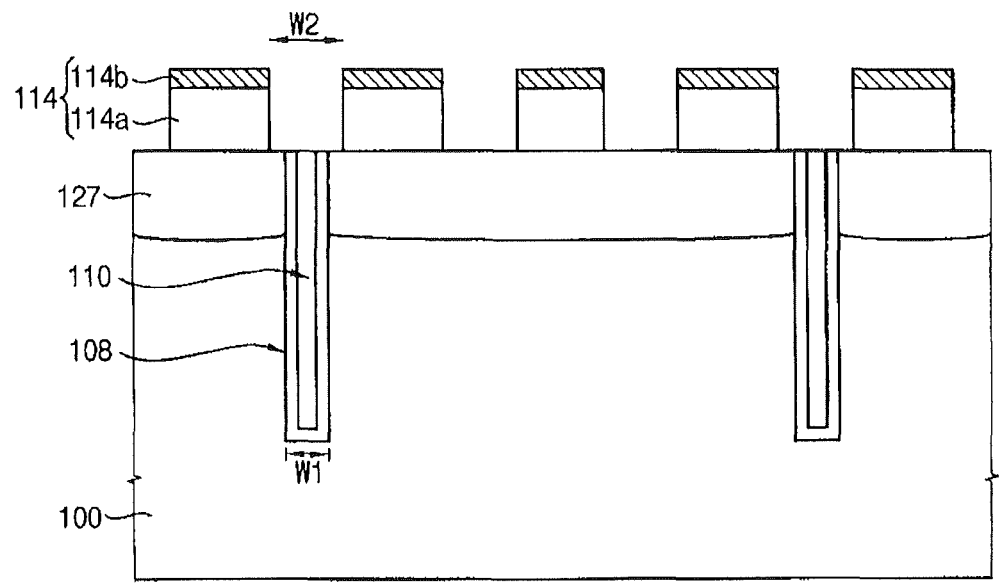

Referring to FIG. 4C, a second hard mask pattern 114 for forming a trench for gate may be formed on a substrate 100 including the preliminary device isolation layer pattern 110. The second hard mask pattern 114 may have a stacked structure of different materials. Particularly, the second hard mask pattern 114 may have the stacked structure of an amorphous carbon layer pattern 114b on a silicon oxide layer pattern 114a.

The second hard mask pattern 114 may selectively expose a portion for forming a trench for gate. Thus, the second hard mask pattern 114 may have a line shape extended in the second direction. The second hard mask pattern 114 may expose a portion of the preliminary active region 101 and a portion of the preliminary device isolation layer pattern 110.

Particularly, the second width W2 of the exposed portion of the second hard mask pattern 114 may be greater than the first width W1 of the preliminary device isolation layer pattern 110 positioned between the active regions separated in the first direction. Accordingly, a portion of the upper surface of the preliminary device isolation layer pattern 110 and the upper surface of the preliminary active region 101 may be exposed by the second hard mask pattern 114.

Figure 4D:
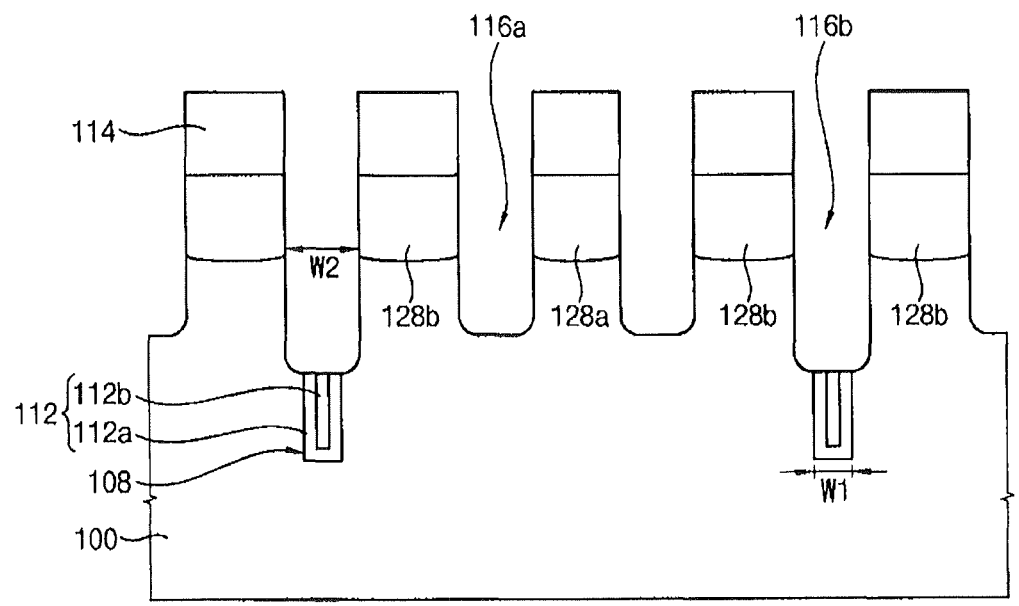
Figure 5D:
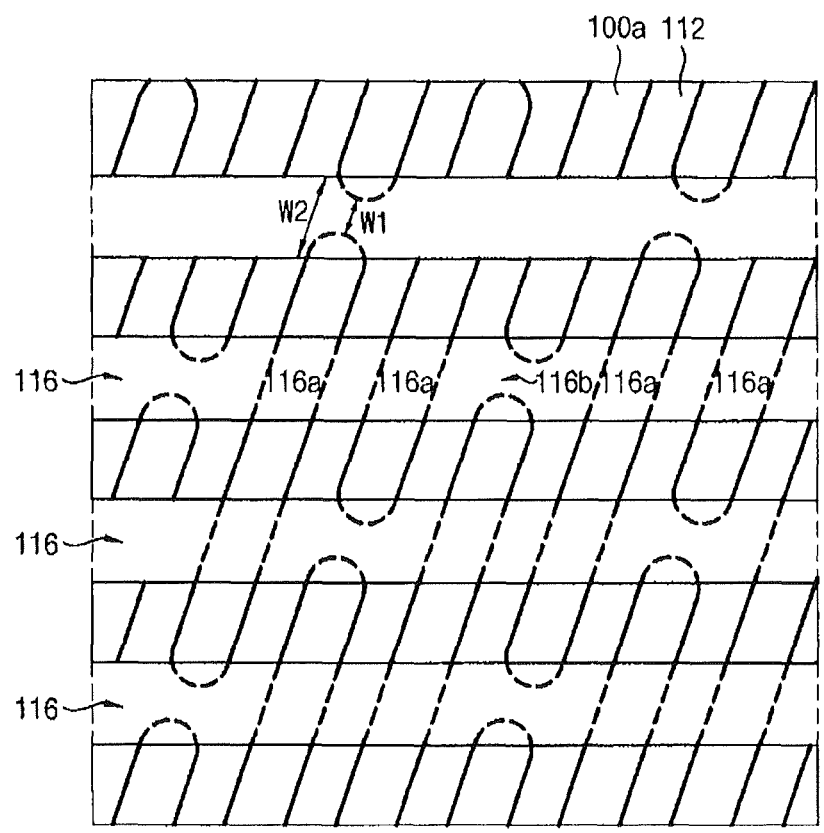

Referring to FIGS. 4D and 5D, the substrate 100 of the exposed preliminary active region 101 and the preliminary device isolation layer pattern 110 may be respectively etched by using the second hard mask pattern 114 as an etching mask to form trenches 116a and 116b for gates. Through the etching process, the preliminary device isolation layer pattern 110 may be etched to respectively form the device isolation layer pattern 112 and the active region 100a. In addition, by partially removing a portion of the substrate 100 at the portion for forming the preliminary impurity region 127, the first and second impurity regions 128a and 128b provided as the source/drain of a buried transistor may be formed in the active region 100a between the trenches 116a and 116b for gates.

The trenches 116a and 116b for gates may have a line shape extended in the second direction. Through the bottom surface of the trenches 116a and 116b for gates having one line shape, the substrate 100 or the device isolation layer pattern 112 may be exposed.

After performing the etching process, because the etching rate of portions of the substrate 100 and the preliminary device isolation layer pattern 110 may be different, the trenches 116a and 116b for gates may not be formed having the same depth at each position. In other words, because the preliminary device isolation layer pattern 110 may be etched relatively fast, the depth of a trench for gate at a portion exposing the preliminary device isolation layer pattern 110 thereunder may be greater.

The disposition of the trenches 116a and 116b for gates may be explained with respect to one isolated active region 100a. Two (e.g., first and second) trenches 116a may be disposed with a distance therebetween in parallel in one isolated active region 100a. In addition, both edge portions of the isolated active region 100a may make contact with the side walls of respective (e.g., third and fourth) trenches 116b. Through forming the third and fourth trenches 116b by the etching process, both edge portions of the isolated active region 100a may be determined. In addition, the upper side wall of both edge portions of the isolated active region 100a may not make contact with the device isolation layer pattern 112.

The first and second trenches 116a may be formed by etching the substrate in the preliminary active region 101. Thus, the device isolation layer pattern 112 may not be provided under the finally formed first and second trenches 116a.

In addition, the width of the exposed portion of the second hard mask pattern 114 for forming the third and fourth trenches 116*b* may be greater than the width of the preliminary device isolation layer pattern 110. Accordingly, the inner width of the finally formed third and fourth trenches 116*b* may be greater than the upper width of the device isolation layer pattern 112 exposed through the bottom surface of the third and fourth trenches 116*b*. The upper surface of the device isolation layer pattern 112 formed by the etching process may be planar. In addition, in some embodiments, the edge portion of the isolated active region 100*a* may not have a rounded shape but may have the same linear shape as the trenches 116*a* and 116*b* for gates.

Through performing the etching process, most of an amorphous carbon layer pattern 114*b*, which may be a portion of the second hard mask pattern 114, may be removed. Moreover, the amorphous carbon layer pattern 114*b* remaining after performing the etching process may also be removed.

Figure 4E:
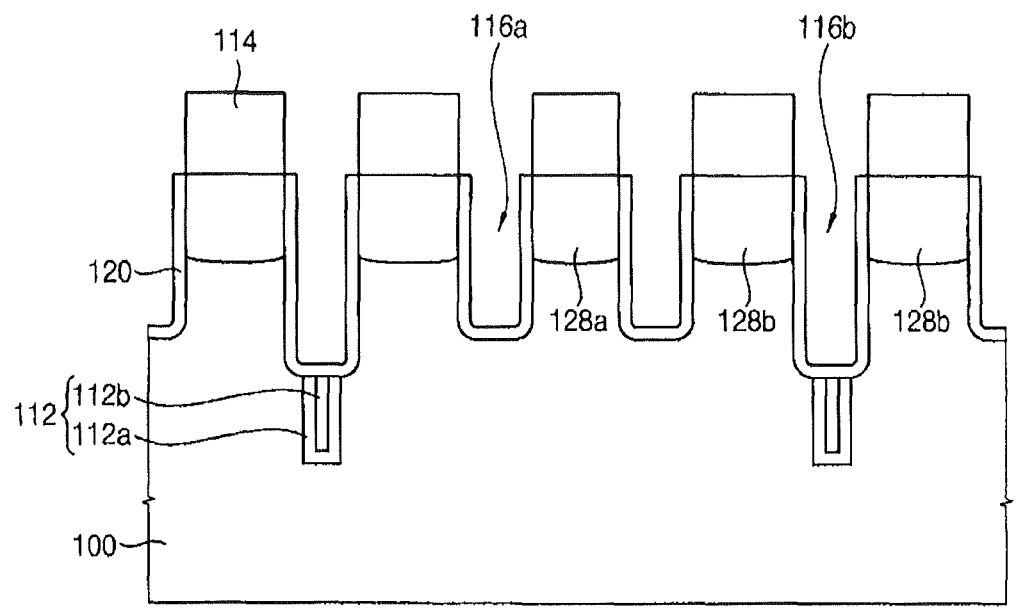

Referring to FIG. 4E, a gate insulating layer 120 may be formed along a side wall and a bottom surface of the trenches 116*a* and 116*b* for gates. The gate insulating layer 120 may be formed by a thermal oxidation process or a chemical vapor deposition process. For example, through performing a thermal oxidation process, the surface of the exposed substrate 100 to a side wall of the trenches 116*a* and 116*b* for gates may be oxidized to form the gate insulating layer 120. As another example, through performing a chemical vapor deposition process, the gate insulating layer 120 may also be formed on the surface of the exposed substrate 100 to a side wall of the trenches 116*a* and 116*b* for gates, the upper surface of the device isolation layer pattern 112 thereunder, and on the surface of the second hard mask pattern 114.

The gate insulating layer 120 may insulate the active regions 100*a* separated in the first direction from each other. The gate insulating layer 120 may be formed to have a thickness to sufficiently insulate the separated active regions 100*a* from each other.

Figure 4F:
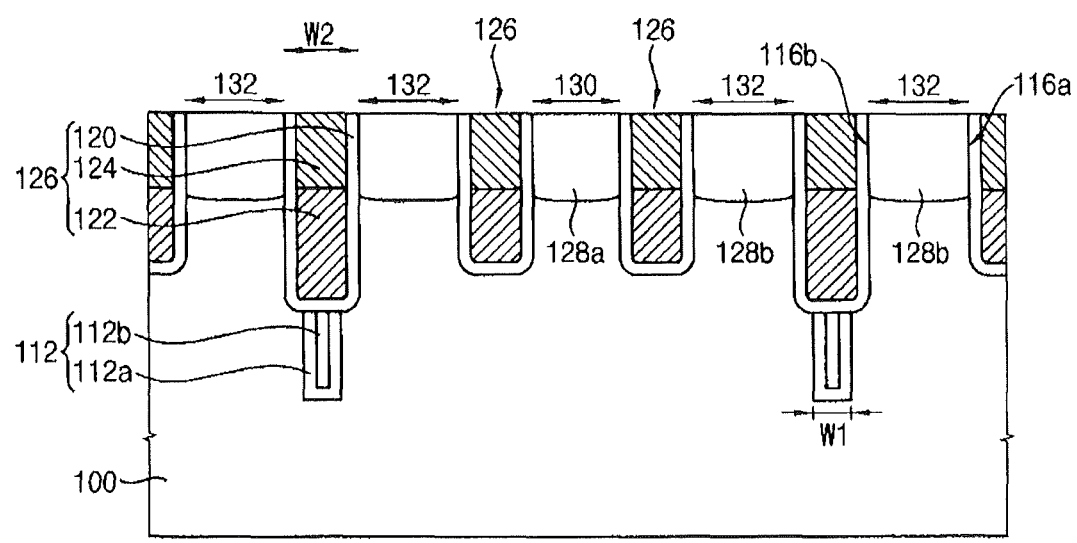

Referring to FIG. 4F, a conductive layer filling up the trenches 116*a* and 116*b* for gates may be formed on the gate insulating layer 120. The conductive layer may be formed by depositing a barrier metal layer and a metal layer one by one. Materials used for forming the barrier metal layer may include titanium and titanium nitride. Materials used for forming the metal layer may include tungsten. After planarizing the conductive layer by a chemical mechanical polishing process, an etch back process may be performed to form a buried gate electrode 122 for partially filling up the trenches 116*a* and 116*b* for gates.

An insulating layer filling up the inner portion of the trenches 116*a* and 116*b* for gates may be formed on the buried gate electrode 122. Then, the insulating layer may be planarized to form an insulating layer pattern 124. The insulating layer pattern 124 may include a nitride layer, an oxide layer, or a stacked structure of the nitride layer and the oxide layer.

Then, the second hard mask pattern 114 may be removed. Through performing the above-described processes, a buried gate structure 126 including the gate insulating layer 120, the buried gate electrode 122, and the insulating layer pattern 124 stacked one by one may be obtained.

The buried gate structure 126 may make contact with the upper surface of the device isolation layer pattern 112 between the active regions 100*a* separated in the first direction. The width W2 of the buried gate structure 126 positioned between the active regions 100*a* separated in the first direction may be greater than the width W1 of the device isolation layer pattern 112 in the first direction disposed under the buried gate structure 126.

Through performing the above-described processes, two buried gate structures 126, that is, first and second buried gate structures 126 may be disposed in parallel in one isolated active region 100*a*. In addition, at both edge portions of the isolated active region 100*a*, third and fourth buried gate structures 126 may be provided, respectively. In the isolated active region 100*a*, the third and fourth buried gate structures 126 may not function as the substantial gate of a transistor. The upper surface of a portion of the active region 100*a* between the first and second buried gate structures 126 may be a first contact forming region 130, and the upper surface between the first and second buried gate structures 126 and both edge portions of the active region 100*a* may become a second contact forming region 132. In the active region 100*a*, the upper surface of the portion for forming the first impurity region 128*a* may become the first contact forming region 130, and the upper surface of the portion for forming the second impurity region 128*b* may become a second contact forming region 132.

Because both edge portions of the isolated active region 100*a* may make contact with the third and fourth buried gate structures 126, the area of the upper surface in the isolated active region 100*a* may be increased. That is, the area of the second contact forming region 132 may be increased. As described herein, as the horizontal area of the second contact forming region 132 increases, the resistance of a contact formed in the second contact forming region 132 may decrease.

Figure 6:
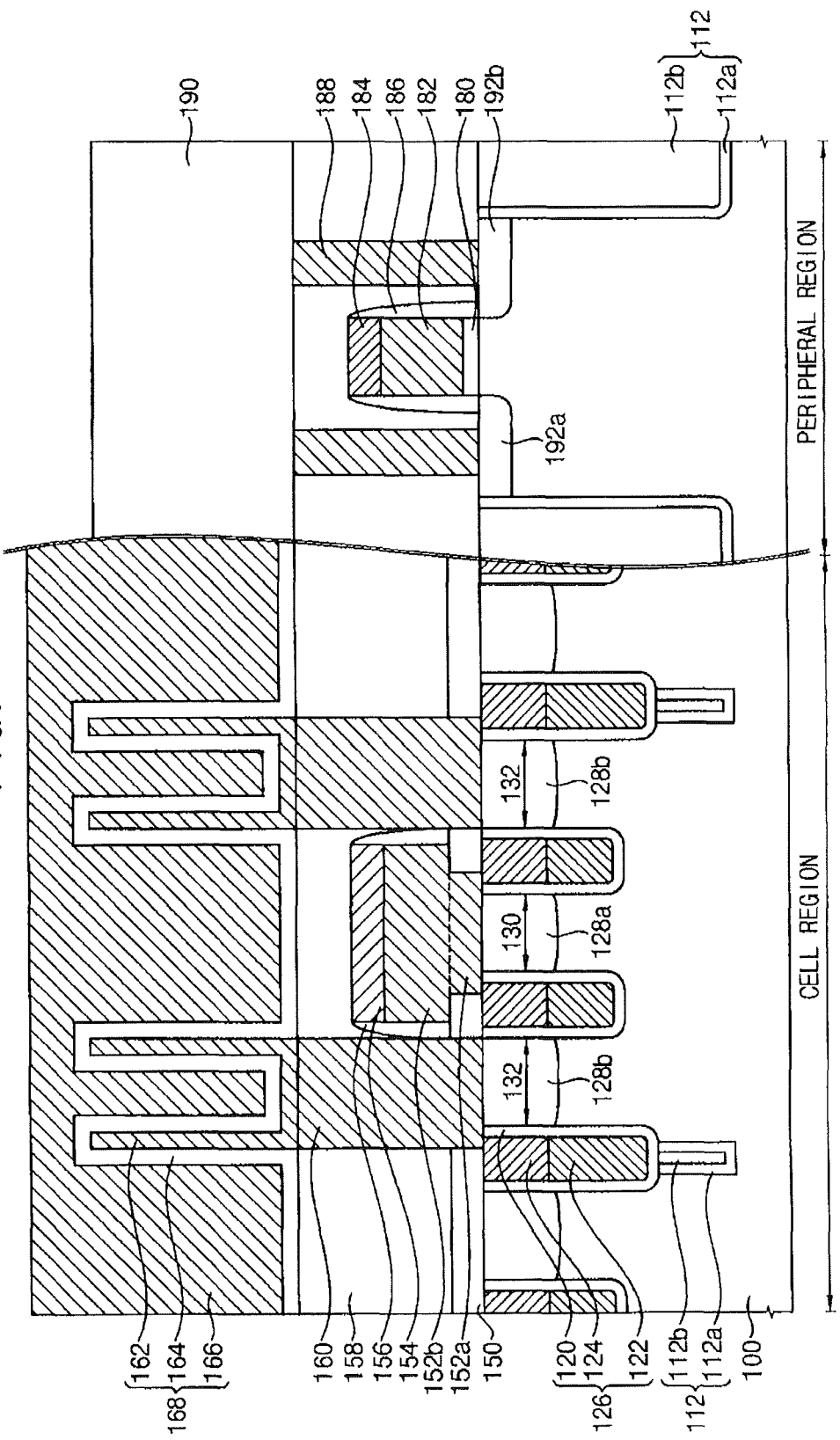

FIG. 6 is a cross-sectional view illustrating a DRAM device with the buried gate structure 126 illustrated in FIG. 1. The DRAM device illustrated in FIG. 6 may include a transistor having the same structure as the transistor including the buried gate structure 126 illustrated in FIG. 1.

Referring to FIG. 6, a substrate 100 including a cell region and a peripheral circuit region may be provided. In the portion of the substrate 100 in the cell region, a transistor including the same buried gate structure 126 as in FIG. 1 may be provided. On the portion of the substrate 100 including the buried gate structure 126, a first insulating interlayer 150 may be provided. Through the first insulating interlayer 150, a first contact 152*a* making contact with the first contact forming region 130 may be provided. The first contact 152*a* may be provided as a bit line contact. On the first contact 152*a*, a bit line 152*b* may be disposed. On the bit line 152*b*, a third hard mask pattern 154 may be disposed. The bit line 152*b* may have an extended shape in the third direction, which may be perpendicular to the second direction.

On the first insulating interlayer 150, a second insulating interlayer 158 covering the bit line 152*b* may be disposed. Through the second insulating interlayer 158, a second contact 160 making contact with the second contact forming region 132 may be disposed. As described herein, because both edge portions of the active region 100*a* may make contact with a buried gate structure 126, the area of the upper surface of the second contact forming region 132 may increase. Thus, the contacting area at the bottom portion of the second contact 160 may increase to decrease the resistance of the second contact 160.

On the upper surface of the second contact 160, a capacitor 168 may be disposed. The capacitor 168 may include a lower electrode 162, a dielectric layer 164 and an upper electrode 166. Thus, the second contact 160 may be provided as a storage node contact for making contact with the lower electrode 162 of the capacitor 168.

In a portion of the substrate 100 in the peripheral circuit region, a planar type transistor may be provided. In the portion of the substrate 100 in the peripheral circuit region, a device isolation layer pattern 112 for defining a device isolation region and an active region may be provided. The device isolation layer pattern 112 in the peripheral circuit region may have the same stacked structure of a silicon nitride layer 112a and a silicon oxide layer 112b as the device isolation layer pattern 112 formed in the cell region.

On the surface of the portion of the substrate 100 in the peripheral circuit region, a second gate structure including a second gate insulating layer 180, a second gate electrode 182, and a fourth hard mask pattern 184 stacked one by one may be provided. The second gate electrode 182 included in the second gate structure may include the same material as the bit line 152b. In addition, third and fourth impurity regions 192a and 192b used as source/drain regions may be provided at the surface portion of the substrate 100 at both sides of the second gate structure.

On the portion of the substrate 100 in the peripheral region, a second insulating interlayer 158 covering the second gate structure may be provided. Through the second insulating interlayer 158, a third contact 188 making contact with the third and fourth impurity regions 192a and 192b may be provided. The third contact 188 may include the same material as the second contact 160 provided on the substrate 100 in the cell region. Moreover, on the portion of the second insulating interlayer 158 formed in the peripheral region, a third insulating interlayer 190 may be provided.

As described herein, because both edge portions of the active region 100a may make contact with a buried gate structure 126, the area of the upper surface of the second contact forming region 132 may be increased. Accordingly, the contacting area at the lower portion of the second contact 160 may be increased to decrease the resistance of the second contact 160.

Figure 7A:
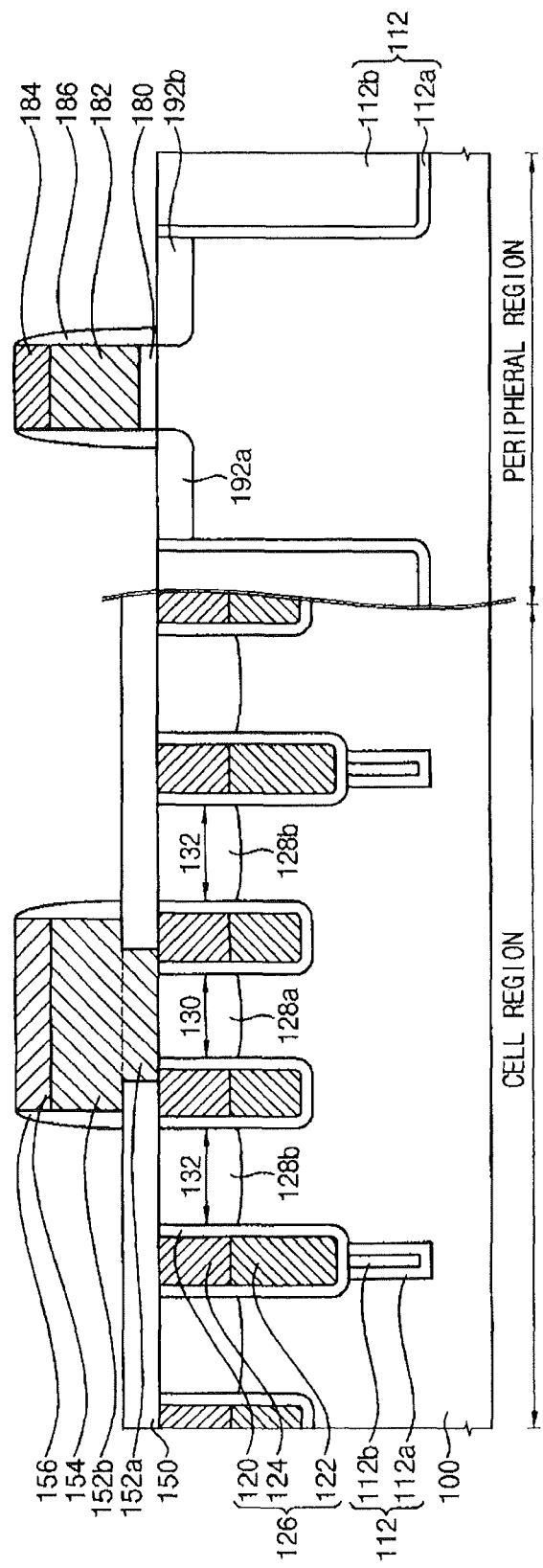
FIGS. 7A and 7B are cross-sectional views illustrating a method for fabricating the DRAM device illustrated in FIG. 6.
Figure 7B:
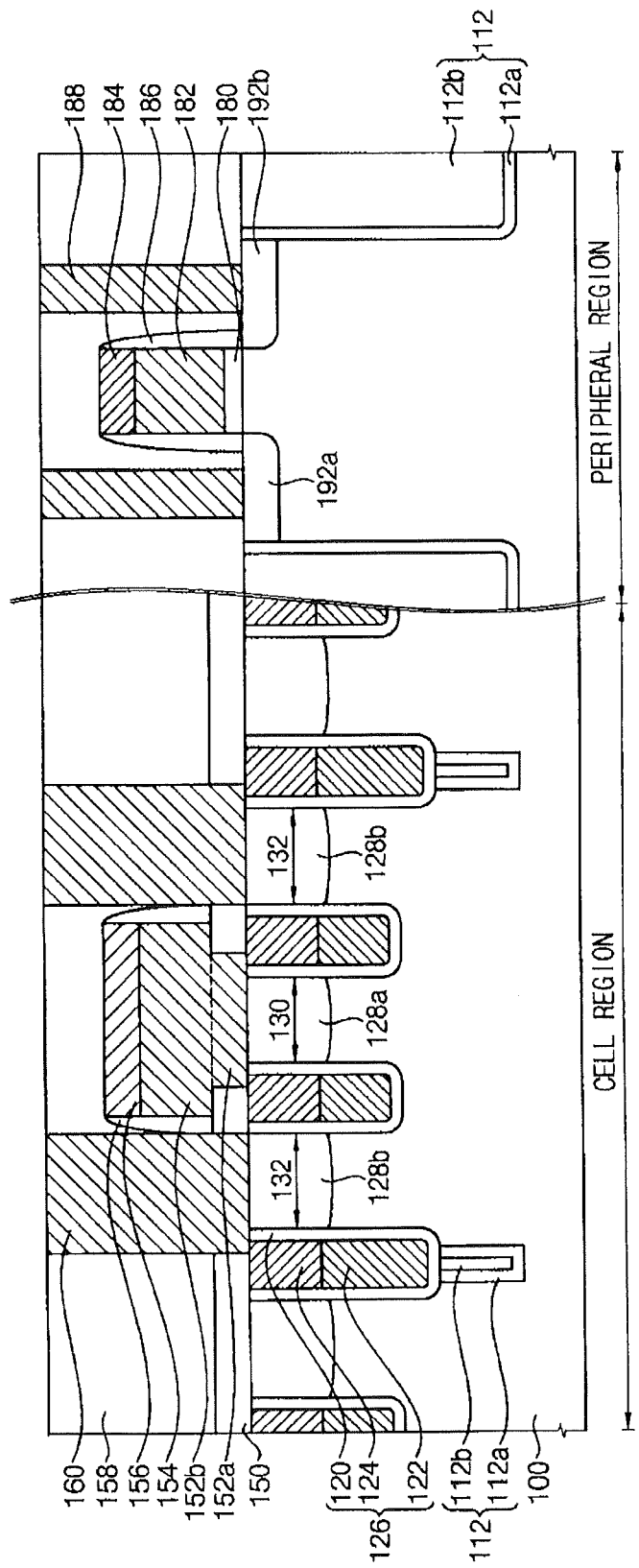

FIGS. 7A and 7B are cross-sectional views illustrating a method of manufacturing the DRAM device illustrated in FIG. 6. Referring to FIG. 7A, a shallow trench device isolation process may be performed with respect to a substrate 100 that is divided into a cell region and a peripheral circuit region to form respective device isolation layer patterns 112. Then, the same procedure may be performed as described herein referring to FIGS. 4A to 4F to form a transistor including a buried gate structure 126 as illustrated in FIG. 4F.

Then, a first insulating interlayer 150 may be formed on the substrate 100 including the buried gate structure 126. A portion of the first insulating interlayer 150 formed in the cell region may be anisotropically etched to form a first contact hole penetrating the first insulating interlayer 150 and exposing a first surface portion of the substrate 100 in the first contact forming region 130. In addition, a portion of the first insulating interlayer 150 formed in the peripheral circuit region may be etched to form a first opening portion exposing the substrate 100 at the gate forming portion of a planar transistor. A second gate insulating layer 180 may be formed on a portion of the substrate 100 exposed through the bottom surface of the first opening portion. The second gate insulating layer 180 may be formed by depositing silicon oxide through a thermal oxidation process or a chemical vapor deposition process.

A conductive layer filling up the inner portion of the first contact hole and the first opening portion may be formed on the first insulating interlayer 150. On the conductive layer, third and fourth hard mask patterns 154 and 184 used as etching masks may be formed, respectively. On the conductive layer in the cell region, the third hard mask pattern 154 for forming a bit line may be formed. In the peripheral region, the fourth hard mask pattern 184 for forming the gate of the planar transistor may be formed. The third hard mask pattern 154 may have a line shape extended in the third direction.

By etching the conductive layer using the third and fourth hard mask patterns 154 and 184 as etching masks, a first contact 152a and a bit line 152b making contact with the first contact 152a may be formed on the first contact forming region 130 in the cell region, and a second gate electrode 182 may be formed in the peripheral circuit region, respectively. Then, most of the first insulating interlayer 150 formed in the peripheral circuit region may be removed to form a second gate structure.

Insulating spacers 156 and 186 may be formed on the side wall of the bit line 152b and on the side wall of the second gate structure, respectively. In addition, impurities may be doped into the substrate 100 at both sides of the second gate structure to form third and fourth impurity regions 192a and 192b provided as source/drain regions of a planar transistor.

As described herein, the second gate structure of the planar transistor may be formed together in the peripheral circuit region while forming the bit line 152b in the cell region. Accordingly, the bit line 152b and the second gate electrode 182 may be formed by using the same material.

Referring to FIG. 7B, on the first insulating interlayer 150 in the cell region and on a portion of the substrate 100 in the peripheral region, a second insulating interlayer 158 may be provided. The second insulating interlayer 158 may have a shape covering the bit line 152b and the planar transistor.

A portion of the first and second insulating interlayers 150 and 158 in the cell region may be anisotropically etched to form a second contact hole exposing a second surface portion of the substrate 100 in the second contact forming region 132. In addition, a portion of the second insulating interlayer 158 in the peripheral region may be etched to form a third contact hole exposing a third surface portion of the substrate 100 in the third and fourth impurity regions 192a and 192b.

A conductive layer filling up the inner portion of the second and third contact holes may be formed. The conductive layer may be planarized to form a second contact 160 and a third contact 188 in the second and third contact holes, respectively.

As described herein, because the area of the upper surface of the second contact forming region 132 may increase, the contact resistance of the second contact 160 may decrease. The second contact 160 may be provided as a storage node contact.

Referring again to FIG. 6, capacitors may be formed on the upper surface of the second contact 160. A capacitor 168 may be formed as a cylinder-type capacitor or a stack-type capacitor. On the second insulating interlayer 158 in the peripheral region, a third insulating interlayer 190 may be formed. Through performing the above-described processes, the DRAM device illustrated in FIG. 6 may be completed.

The semiconductor devices in accordance with example embodiments described herein may be mounted on a semiconductor package having diverse types. In addition, the semiconductor devices and semiconductor packages including the same may be applied in various types of systems including a computing system.

Figure 8:
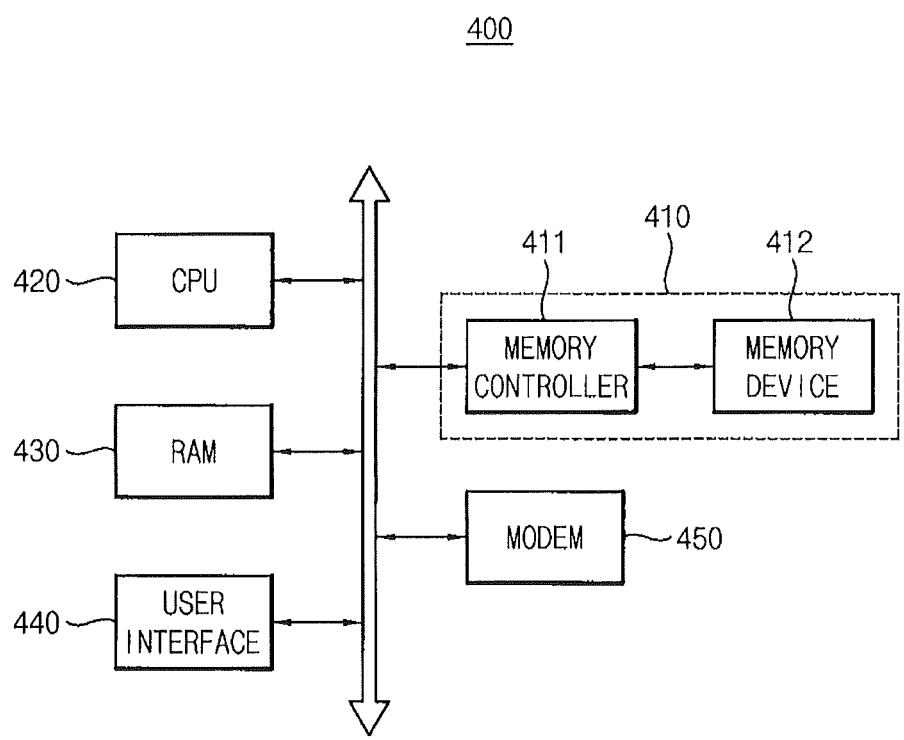

FIG. 8 is a block diagram illustrating a schematic diagram of a computing system in accordance with various embodiments described herein. Referring to FIG. 8, a computing system 400 may include a microprocessor (CPU) 420, a Random Access Memory (RAM) 430, a user interface 440, a modem 450 such as a baseband chipset, and a memory system 410, electrically connected to a system bus. The memory system 410 may include a memory device 412 and a memory controller 411. The memory device 412 may include a semiconductor device or a DRAM device in accordance with example embodiments described herein. The memory controller 411 may be constituted to control the memory device 412. Through combining the memory device 412 and the memory controller 411, the memory system 410 may be provided as a memory card or a semiconductor disk device such as a solid state disk (SSD). When the computing system 400 is a mobile apparatus, a battery for supplying an operating voltage for the computing system 400 may be additionally provided. In some embodiments, the computing system 400 may further include an application chipset, a camera image processor (CIS), a mobile DRAM, etc.

As described herein, a semiconductor device having an increased area of the upper surface of a contact forming region may be provided. The semiconductor device may be used in a memory device such as a DRAM device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate comprising first, second, and third active regions defined by a device isolation layer pattern, each of the first, second, and third active regions comprising an isolated shape in a first direction comprising a longitudinal direction, the first and third active regions being arranged in parallel in the first direction, and the first and second active regions being spaced apart and immediately adjacent each other in the first direction;
   first and second trenches in the substrate;
   a first buried gate structure in the first trench in the first active region;
   a second buried gate structure in the second trench between upper sidewalls of the first and second active regions, respectively, the second buried gate structure comprising a line shape extending in a second direction and a second width that is wider in the first direction than a first width of the device isolation layer pattern between the first and second active regions; and
   first and second impurity regions at surface portions of the substrate in the first active region at opposing sides of the first buried gate structure.

2. The semiconductor device of claim 1, wherein a bottom surface of the second buried gate structure contacts an upper surface of the device isolation layer pattern.

3. The semiconductor device of claim 2, wherein the second buried gate structure protrudes from an interface with the device isolation layer pattern.

4. The semiconductor device of claim 1, wherein:
   the semiconductor device further comprises a fourth active region spaced apart from and immediately adjacent the first active region in the first direction;
   the semiconductor device further comprises a third buried gate structure in a third trench between upper sidewalls of the first and fourth active regions, respectively;
   the upper sidewall of the first active region adjacent the second buried gate structure comprises a first upper sidewall of a first end portion of the first active region and contacts a sidewall of the second buried gate structure; and
   the upper sidewall of the first active region adjacent the third buried gate structure comprises a second upper sidewall of a second end portion of the first active region and contacts a sidewall of the third buried gate structure.

5. The semiconductor device of claim 1, wherein:
   the second buried gate structure comprises a gate insulating layer, a buried gate electrode, and an insulating layer pattern; and
   the gate insulating layer is on an inner wall of the second trench.

6. The semiconductor device of claim 5, wherein the gate insulating layer contacts the respective upper sidewalls of the first and second active regions.

7. The semiconductor device of claim 1, wherein an upper corner of an end portion of the first active region comprises a linear shape.

8. The semiconductor device of claim 1, wherein an end portion of the first active region comprises an equivalent shape to a sidewall of the second buried gate structure.

9. The semiconductor device of claim 1, further comprising a third buried gate structure in a third trench in the first active region.

10. The semiconductor device of claim 9, wherein:
    an upper surface of a portion of the first active region between the first and third buried gate structures contacts a first contact; and
    an upper surface of a portion of the first active region between the first and second buried gate structures contacts a second contact.

11. The semiconductor device of claim 10, further comprising a bit line on an upper surface of the first contact and a capacitor on an upper surface of the second contact.

12. A method for forming a semiconductor device, comprising:
    forming first, second, and third preliminary active regions each comprising an isolated shape comprising a longitudinal direction in a first direction, the first and second preliminary active regions being spaced apart and immediately adjacent each other in the first direction, and the first and third preliminary active regions being arranged in parallel to the first direction, by forming a preliminary device isolation layer pattern in a substrate;
    forming first and second trenches in the substrate extending in a second direction by partially etching the substrate in the first preliminary active region and the preliminary device isolation layer pattern, to provide first and second active regions and a device isolation layer pattern;
    forming a first buried gate structure in the first trench in the first active region;
    forming a second buried gate structure in the second trench between upper sidewalls of the first and second active regions, the buried gate structure comprising a second width wider in the first direction than a first width of the device isolation layer pattern between the first and second active regions; and
    forming impurity regions at surface portions of the substrate in the first active region at opposing sides of the first buried gate structure.

13. The method of claim 12, wherein the preliminary device isolation layer pattern between the first and second preliminary active regions comprises a narrower width than the second width of the buried gate structure.

14. The method of claim 12, wherein forming the first and second trenches comprises forming the first trench to a first depth in the substrate that is shallower than a second depth of the second trench overlying the device isolation layer pattern.

15. The method of claim 12, wherein forming the second buried gate structure comprises:

forming an insulating layer on an inner wall of the second trench;

forming a buried gate electrode on the gate insulating layer to fill a portion of the second trench; and forming an insulating layer pattern on the buried gate electrode to fill the second trench.

16. A semiconductor device comprising:

a substrate;

an isolation pattern in the substrate;

first, second, and third active regions of the substrate, the first active region between the second and third active regions in a direction, and the first active region comprising an end portion immediately adjacent the second active region in the direction and spaced apart from the second active region by a first width of the isolation pattern in the direction; and a gate structure between the first and second active regions and comprising a second width wider than the first width of the isolation pattern in the direction.

17. The semiconductor device of claim 16, wherein the gate structure between the first and second active regions overlies the isolation pattern.

18. The semiconductor device of claim 16, wherein:

the end portion immediately adjacent the second active region in the direction comprises a first end portion; and the first active region further comprises a second end portion immediately adjacent the third active region in the direction.

19. The semiconductor device of claim 18, wherein:

the gate structure comprises a first gate structure;

the semiconductor device further comprises a second gate structure between the first and third active regions; and the first and second end portions of the first active region physically contact the first and second gate structures, respectively.

20. The semiconductor device of claim 19, further comprising first and second contacts physically contacting the first and second gate structures.

* * * * *